United States Patent
Kolb et al.

(10) Patent No.: US 6,373,115 B1
(45) Date of Patent: Apr. 16, 2002

(54) MICROMECHANICAL STRUCTURE, SENSOR AND METHOD FOR MANUFACTURING THE SAME

(75) Inventors: Stefan Kolb, Unterschleissheim; Dieter Maier-Schneider, Markt Schwaben; Klaus-Günter Oppermann, Holzkirchen; Hans-Jörg Timme, Ottobrunn, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/384,905

(22) Filed: Aug. 27, 1999

(30) Foreign Application Priority Data

Aug. 27, 1998 (DE) .......................................... 198 39 123

(51) Int. Cl.[7] .......................... H01L 29/82; H01L 21/00; H01L 21/302
(52) U.S. Cl. ...................... 257/414; 257/415; 257/417; 257/418; 257/419; 257/467; 438/5; 438/7; 438/51; 438/53; 438/702; 438/756
(58) Field of Search ................................ 257/414, 417, 257/418, 419, 415, 467; 438/702, 53, 756, 5, 7, 51

(56) References Cited

U.S. PATENT DOCUMENTS

| | | | |
|---|---|---|---|
| 4,766,666 A | | 8/1988 | Sugiyama et al. |
| 4,838,088 A | * | 6/1989 | Murakami ............... 361/283.4 |
| 5,528,070 A | * | 6/1996 | Cahill ........................ 257/419 |
| 5,963,782 A | * | 10/1999 | Webb ........................... 438/15 |

FOREIGN PATENT DOCUMENTS

| | | |
|---|---|---|
| EP | 0 714 017 A1 | 5/1996 |
| EP | 0 783 108 A1 | 7/1997 |

OTHER PUBLICATIONS

German Utility Model G 91 05 851.1, dated Aug. 14, 1991, pressure sensor.

Christopher Hierold et al.: "CMOS–kompatible Oberflächenmechanik: Schlüsseltechnologie für integrierte Mikrosysteme" [CMOS–compatible surface mechanics: key technology for integrated microsystems], in ITG–Fachbericht—Sensoren und Messtechnik, VDE–Verlag, Berlin, 1998, pp. 15–22.

* cited by examiner

Primary Examiner—Matthew Smith
Assistant Examiner—Igwe U. Anya
(74) Attorney, Agent, or Firm—Herbert L. Lerner; Laurence A. Greenberg; Werner H. Stemer

(57) ABSTRACT

A micromechanical structure, such as a sensor, includes a substrate, a diaphragm, a cavity, a sacrificial layer and a terminating structure. The terminating structure is cut away in the region of the diaphragm in such a way that a media opening is located above the diaphragm. The diameter of the cavity is smaller over the entire circumference of the cavity than the diameter of the opening. A method for manufacturing the micromechanical structure is also provided.

19 Claims, 2 Drawing Sheets

Prior Art

MICROMECHANICAL STRUCTURE, SENSOR AND METHOD FOR MANUFACTURING THE SAME

BACKGROUND OF THE INVENTION

Field of the Invention

The present invention relates to a micromechanical structure, preferably a sensor element, including a substrate, a diaphragm, a cavity disposed between the diaphragm and the substrate, a sacrificial layer serving as a peripheral support for the diaphragm, and a terminating structure, the terminating structure being cut away in the region of the diaphragm in such a way that a media opening is located above the diaphragm. The invention also relates to a method for manufacturing a micromechanical structure. The invention additionally relates to micromechanical sensors, such as pressure sensors, microphones or acceleration sensors, for example.

Micromechanical structures with drive or evaluation electronics which are integrated on the chip are known, for example, from European Patent Application EP 0 714 017 A1. Those structures are used, for example, as pressure sensors in the motor vehicle industry, as acceleration sensors or in microphones. FIG. 3 shows a pressure sensor known from the prior art which is described in detail below.

Certain applications require micromechanical structures which have properties that are as reproducible as possible. Thus, for example, in a sensor during an absolute pressure measurement, the sensor characteristic curve must not change significantly over a relatively long period of time. However, in particular in motor vehicles, the sensors in question are exposed to aggressive environmental conditions such as severe differences in temperature, high levels of atmospheric humidity, salt-containing atmospheres, etc. The known micromechanical structure which is described with reference to FIG. 3 only fulfills that requirement to a certain degree. In the micromechanical structure, the mechanical properties of the diaphragm are determined to a considerable degree by the residual structures located on the diaphragm. A further problem is that the terminating structures which are located in the outer region of the diaphragm act on the mechanical properties of the diaphragm. The terminating structure as a rule is significantly thicker than the diaphragm. As a result, different thermal coefficients of expansion or manufacturing process-related fluctuations result in stresses which affect the diaphragm surface.

SUMMARY OF THE INVENTION

It is accordingly an object of the invention to provide a micromechanical structure, a sensor and a method for manufacturing the same, which overcome the hereinaforementioned disadvantages of the heretofore-known devices and methods of this general type and which provide a diaphragm structure that can be integrated into a semiconductor fabrication process.

With the foregoing and other objects in view there is provided, in accordance with the invention, a micromechanical structure, preferably a micromechanical sensor, comprising a substrate having a wafer surface; at least one diaphragm disposed above the substrate; a cavity disposed between the diaphragm and the substrate, the cavity having a circumference and a given diameter; at least one sacrificial layer serving as a peripheral support for the diaphragm; and a top terminating structure, preferably being planar on the upper side, covering the wafer surface and part of the diaphragm, the terminating structure cut away in the vicinity of the diaphragm to form a media opening above the diaphragm, the media opening extending down at least partially as far as the diaphragm or a closure layer disposed on the diaphragm, and the media opening having a diameter larger than the given diameter over the entire circumference of the cavity.

In accordance with another feature of the invention, the upper surface of the diaphragm does not have any residual structures which terminate in the same plane as the terminating structure. The residual structures are composed, in particular, of residues of the terminating structure.

In accordance with an additional feature of the invention, the at least one diaphragm has at least one hole formed therein, and a closure cap closes off the at least one hole.

In accordance with a further feature of the invention, the closure cap is covered at the top with an etch stop, a continuous or interrupted closure layer which is possibly disposed between the etch stop and closure cap runs parallel to the diaphragm surface, and the sum of the thickness of the etch stop layer and the closure layer, which may possibly be present, is less than the thickness of the terminating structure. It is particularly preferred if the sum of the etch stop layer and the closure layer which is possibly present is less than 50% of the thickness of the terminating structure.

In accordance with another feature of the invention, the opening extends as far as the at least one diaphragm in a region adjacent the closure cap.

In accordance with an added feature of the invention, the surface of the etch stop is less than 50% of the exposed diaphragm surface. It is particularly preferred in this case if the surface of the etch stop is less than 10%, in particular less than 2%.

In accordance with an additional feature of the invention, the diaphragm is made of a single substance. In particular, polycrystalline or monocrystalline silicon is used as the diaphragm material.

In accordance with yet another feature of the invention, a semiconductor circuit with evaluation and/or drive electronics for the micromechanical structure is located on the chip of the structure. In order to manufacture the micromechanical structure and the semiconductor circuit, materials are preferably used which are compatible with a semiconductor fabrication process such as CMOS, BiCMOS or bipolar.

With the objects of the invention in view, there is also provided a method for manufacturing a micromechanical structure, preferably a micromechanical sensor, which comprises a) producing an assembly having a substrate, at least one diaphragm disposed above the substrate and possibly having holes for etching an opening, a cavity disposed between the diaphragm and the substrate, and at least one sacrificial layer serving as a peripheral support surface for the diaphragm, the cavity having a given diameter, and the diaphragm defining a diaphragm region and a region outside the diaphragm; b) applying a terminating structure on top of the assembly and jointly covering the diaphragm region and the region outside the diaphragm with the terminating structure, the terminating structure having an upper surface; and c) etching an opening in the upper surface of the terminating structure with an etching method being selective with respect to the diaphragm and to an etch stop possibly applied to the diaphragm, the opening having a circumference and the opening having a diameter greater than the given diameter over the entire circumference of the opening.

The holes in the diaphragm are manufactured, in particular, by applying the diaphragm with a structured mask.

In accordance with another mode of the invention, there is provided a method which comprises exposing the cavity before step b) by etching through application of an etching agent through the holes in the at least one diaphragm, and then closing the holes with closure caps.

In accordance with a further mode of the invention, there is provided a method which comprises applying a closure layer to the at least one diaphragm after the holes are closed.

In accordance with an added mode of the invention, after the holes are closed, an etch stop is applied to the diaphragm or to a closure layer which is possibly present, with the etch stop being applied only in the region of the closure caps. The application of the etch stop in the region of the closure caps is expediently carried out in this case by using a mask which has a suitable structure.

With the objects of the invention in view, there is additionally provided a micromechanical sensor, in particular a pressure sensor, to be used, for example, in drive systems or for microphones or acceleration sensors.

Other features which are considered as characteristic for the invention are set forth in the appended claims.

Although the invention is illustrated and described herein as embodied in a micromechanical structure, a sensor and a method for manufacturing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 3:
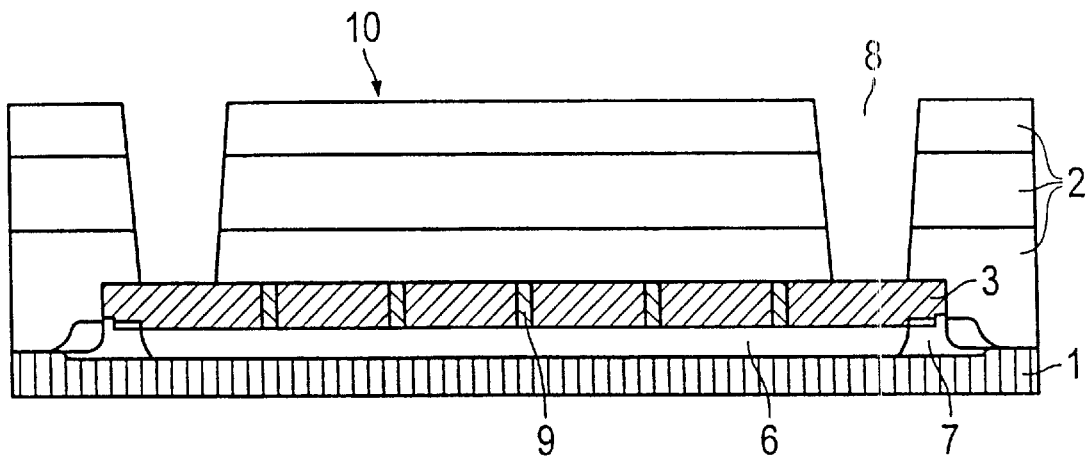
FIG. 3 is a fragmentary, cross-sectional view of a prior art pressure sensor.

Referring now to the figures of the drawings in detail and first, particularly, to FIG. 3 thereof, there is seen a known pressure sensor configuration including a cavity 6 and a diaphragm 3 mounted on a silicon substrate 1 through the use of conventional semiconductor manufacturing technology. A media opening 8 is provided above the diaphragm. It is possible, for example, for a sound wave to pass through the media opening 8 to the material of the diaphragm. As a result, the cavity 6 changes in volume as a function of time. That change in volume can be converted into an electrical signal. That takes place either capacitively or through the use of a piezo configuration. After the media openings have been created, the known pressure sensor element has a residual structure 10 which is located on a surface of the diaphragm and which originates from planarizing and terminating layers that have been previously applied to the chip, or else from layers required to form circuit structures. The residual structure covers holes in the diaphragm which are closed off by closure caps 9 and which are required to expose the cavity 6.

Figure 1:
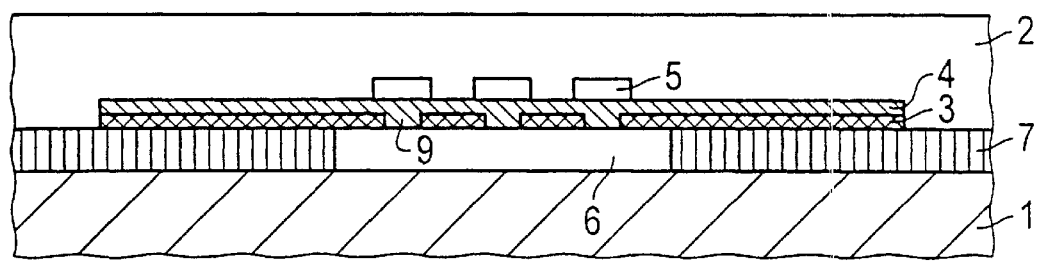
FIGS. 1 and 2 are fragmentary, cross-sectional views of exemplary embodiments of semifinished micromechanical structures according to the invention.
Figure 1A:
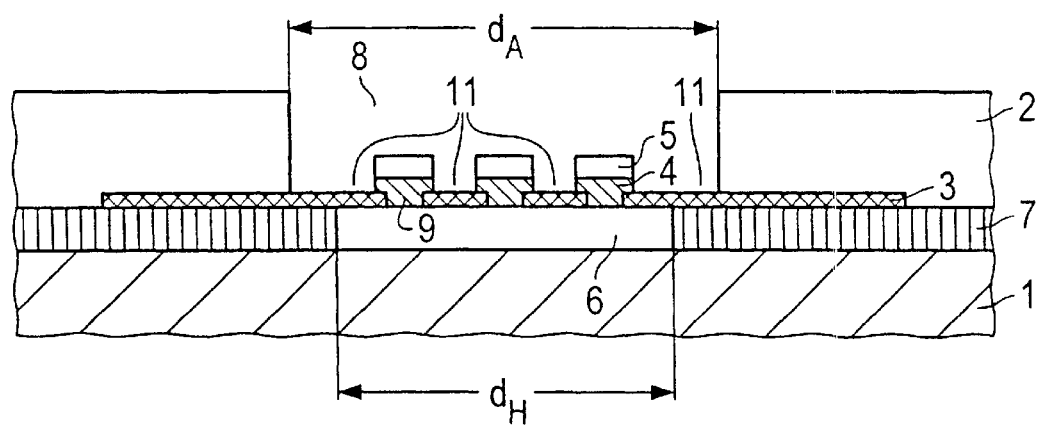
FIGS. 1a and 2a are fragmentary, diagrammatic, cross-sectional views of exemplary embodiments of the invention.

FIG. 1 shows a micromechanical structure of a sensor according to the invention including a substrate 1 made of a silicon wafer, a sacrificial layer 7 which is located on top of the substrate 1 and is made of silicon oxide with a thickness preferably in the region between approximately 0.2 and 4 $\mu$m, a diaphragm layer 3 made of polysilicon or monocrystalline silicon, a closure layer 4 made of a suitable material which is preferably BPSG, an oxide or a nitride, an etch stop 5 made of a suitable material, preferably aluminum, undoped silicon or doped silicon being used as the etch stop, and a terminating structure 2 composed of layers which are customary in semiconductor manufacture. The terminating structure 2 is preferably composed of intermediate oxide layers and a passivation layer made of plasma nitride. A surface of the etch stop 5 is less than 50% of an exposed surface 11 of the diaphragm 3. FIG. 1 shows a semifinished sensor according to the invention with a continuous terminating structure 2. In FIG. 1a a media opening 8 is etched out of the micromechanical sensor according to FIG. 1. The etching of the media opening 8 is carried out selectively with respect to the surface of the diaphragm and the etch stop 5.

Figure 2:
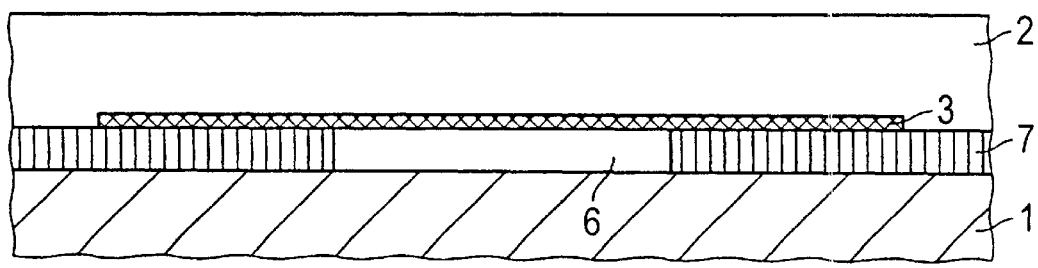
Figure 2A:
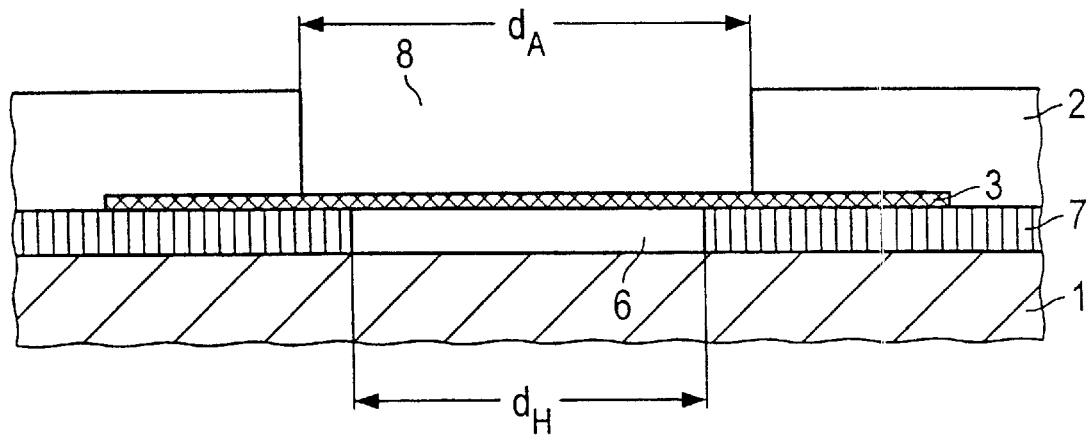

FIG. 2 shows a semifinished structure for a further embodiment according to FIG. 2a. The sensor has a diaphragm 3 with a continuous surface. The etching of the cavity 6 is carried out from the side. FIG. 2a shows the micromechanical sensor with an etched-out media opening 8.

The media opening 8 in FIGS. 1a and 2a has a diameter $d_A$ which is greater, at every point on the periphery of the media opening, than a diameter $d_H$ of the underlying opening of the cavity 6. As a result, a step is produced in the region of a support surface of the diaphragm 3. This step causes the diaphragm to be supported essentially on the sacrificial layer 7. As a result of the diameter of the cavity 6 being smaller in the entire region of the diaphragm support, stresses which are caused by the terminating structure 2 do not affect the surface of the diaphragm 3. The sacrificial layer 7 supports the diaphragm in such a way that the latter is not deformed by mechanical stresses.

The method for manufacturing the sensor according to the invention is explained in more detail below by way of example with reference to FIGS. 1 and 1a. Initially, a sacrificial layer 7 and a diaphragm layer 3 are applied to the wafer 1. Subsequent to this, a cavity 6 is fabricated in accordance with the method described in European Patent Application EP 0 783 108 A1. For this purpose, the diaphragm layer 3 is structured with a photo technique so that it has openings. Using an isotropic etching process, the auxiliary layer is etched as far as the substrate 3 so that the cavity 6 is produced underneath the diaphragm openings. The cavity can, however, also be fabricated according to other customary methods. Subsequent to this, a BPSG closure layer 4 is applied with a thickness which is selected in such a way that at most there is a narrow gap remaining above the openings in the diaphragm 3 after the deposition. The gap can be closed by a subsequent closure process. As a result, closure caps 9 are produced in the region of the diaphragm openings. These closure caps are composed, for example, of an oxide material such as silicon oxide, for example. Finally, a layer 5 which is structured by masking is applied in the region of the diaphragm openings. The layer acts as an etch stop during the etching of the media opening 8. After the exposure of the media opening 8, only small residues of the etch stop layer 5 and of the closure layer 4 remain on the diaphragm 3. The surface of the etch stop layer is, in particular, preferably less than 2% of the diaphragm surface.

The micromechanical structure according to the invention can be fabricated with reproducible properties. The influence of the terminating structure 2 produced on the diaphragm 3 during the semiconductor fabrication process is negligibly small. A further advantage is that on the diaphragm there is no residual structure remaining which terminates in the same plane as the terminating structure.

We claim:

1. A micromechanical structure, comprising:
   a substrate having a wafer surface;
   at least one diaphragm disposed above said substrate;
   a cavity disposed between said diaphragm and said substrate, said cavity having a circumference and a given diameter;
   at least one sacrificial layer serving as a peripheral support for said diaphragm; and
   a top terminating structure covering said wafer surface and part of said diaphragm, said terminating structure cut away in the vicinity of said diaphragm to form a media opening above said diaphragm, said media opening extending at least partially as far as said diaphragm, and said media opening having a diameter larger than said given diameter over said circumference of said cavity.

2. The micromechanical structure according to claim 1, including a closure layer disposed on said diaphragm, said media opening extending at least partially as far as said closure layer.

3. The micromechanical structure according to claim 1, wherein said terminating structure terminates in a given plane, and said at least one diaphragm has an upper surface free of residual structures terminating in said given plane.

4. The micromechanical structure according to claim 1, wherein said at least one diaphragm has at least one hole formed therein, and a closure cap closes off said at least one hole.

5. The micromechanical structure according to claim 4, wherein said closure cap has a top, and an etch stop covers said top of said closure cap.

6. The micromechanical structure according to claim 5, wherein said terminating structure has a given thick ness, said at least one diaphragm has a surface, a continuous closure layer is disposed between said etch stop and said closure cap, said closure layer runs parallel to said surface of said at least one diaphragm, and said etch stop and said closure layer have a combined thickness less than said given thickness.

7. The micromechanical structure according to claim 5, wherein said terminating structure has a given thinkness, said at least one diaphragm has a surface, an interrupted closure layer is disposed between said etch stop and said closure cap, said closure layer runs parallel to said surface of said at least one diaphragm, and said etch stop and said closure layer have a combined thickness less than said given thickness.

8. The micromechanical structure according to claim 5, wherein said opening extends as far as said at least one diaphragm in a region adjacent said closure cap.

9. The micromechanical structure according to claim 5, wherein said at least one diaphragm has an expose surface, and said etch stop has a surface being less than 50% of said exposed surface.

10. The micromechanical structure according to claim 1, wherein said at least one diaphragm is made of a single substance.

11. The micromechanical structure according to claim 1, including a semiconductor circuit with at least one of evaluation and drive electronics for the micromechanical structure disposed on a chip of the micromechanical structure.

12. A method for manufacturing a micromechanical structure, which comprises:
   a) producing an assembly having a substrate, at least one diaphragm disposed above the substrate, a cavity disposed between the diaphragm and the substrate, and at least one sacrificial layer serving as a peripheral support surface for the diaphragm, the cavity having a given diameter, and the diaphragm defining a diaphragm region and a region outside the diaphragm;
   b) applying a terminating structure on top of the assembly and jointly covering the diaphragm region and the region outside the diaphragm with the terminating structure, the terminating structure having an upper surface; and
   c) etching an opening in the upper surface of the terminating structure with an etching method being selective with respect to the diaphragm, the opening having a circumference and the opening having a diameter greater than the given diameter over the circumference of the cavity.

13. The method according to claim 12, which comprises forming holes in the at least one diaphragm for etching the opening.

14. The method according to claim 13, which comprises exposing the cavity before step b) by etching through application of an etching agent through the holes in the at least one diaphragm, and then closing the holes with closure caps.

15. The method according to claim 14, which comprises applying a closure layer to the at least one diaphragm after the holes are closed.

16. The method according to claim 15, which comprises applying an etch stop to the closure layer after the holes are closed, and applying the etch stop only in the vicinity of the closure caps.

17. The method according to claim 14, which comprises applying an etch stop to the diaphragm after the holes are closed, and applying the etch stop only in the vicinity of the closure caps.

18. The method according to claim 12, which comprises applying an etch stop to the diaphragm, and carrying out the step of etching the opening with the etching method being selective with respect to the etch stop.

19. A micromechanical sensor, comprising:
   a substrate having a wafer surface;
   at least one diaphragm disposed above said substrate;
   a cavity disposed between said diaphragm and said substrate, said cavity having a circumference and a given diameter;
   at least one sacrificial layer serving as a peripheral support for said diaphragm; and
   a top terminating structure covering said wafer surface and part of said diaphragm, said terminating structure cut away in the vicinity of said diaphragm to form a media opening above said diaphragm, said media opening extending at least partially as far as said diaphragm, and said media opening having a diameter larger than said given diameter over said circumference of said cavity.

* * * * *